United States Patent
Patel

(10) Patent No.: US 7,088,603 B2
(45) Date of Patent: *Aug. 8, 2006

(54) DRAM CAM MEMORY

(75) Inventor: Vipul Patel, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,574

(22) Filed: Dec. 14, 2004

(65) Prior Publication Data

US 2005/0152166 A1    Jul. 14, 2005

Related U.S. Application Data

(63) Continuation of application No. 10/435,049, filed on May 12, 2003, now Pat. No. 6,839,258.

(51) Int. Cl.
*G11C 15/04* (2006.01)

(52) U.S. Cl. .................... 365/49; 365/189.07; 365/210

(58) Field of Classification Search ..................... None
See application file for complete search history.

(56) References Cited

U.S. PATENT DOCUMENTS

| | | | |
|---|---|---|---|
| 5,319,589 A | 6/1994 | Yamagata et al. | |
| 5,475,825 A | 12/1995 | Yonezawa et al. | |
| 5,936,873 A | 8/1999 | Kongetira | |
| 6,442,054 B1 * | 8/2002 | Evans et al. | ................... 365/49 |
| 6,744,653 B1 * | 6/2004 | Huang | ......................... 365/49 |

* cited by examiner

*Primary Examiner*—Son Mai
(74) *Attorney, Agent, or Firm*—Dickstein Shapiro Morin & Oshinsky LLP

(57) ABSTRACT

A CAM device combines a folded bit line architecture with a standard six transistor DRAM based CAM cell and includes a sensing scheme where the active and reference bit lines being sensed are each from the same memory array of the CAM device. Noise present in one array therefore appears as common mode noise in both the active and reference bit lines, thereby permitting the sensing operation to be performed accurately even in the presence of increased noise.

10 Claims, 6 Drawing Sheets

DRAM CAM MEMORY

This application is a continuation of application Ser. No. 10/435,049 filed May 12, 2003 (now U.S. Pat. No. 6,839,258 now allowed and the issue fee paid), which is hereby incorporated by reference in its entirety.

FIELD OF INVENTION

The present invention relates generally to semiconductor memory devices and, more particularly to sensing DRAM based content addressable memory (CAM).

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM). For example, data is stored in a RAM in a particular location, called an address. During a memory access, the user supplies an address and writes into or reads the data at the specified address.

In a CAM, however, data is stored in locations in a somewhat random fashion. The locations can be selected by an address bus, or the data can be written into the first empty memory location. Every memory location includes one or more status bits which maintain state information regarding the memory location. For example, each memory location may include a valid bit whose state indicate whether the memory location stores valid information, or whether the memory location does not contain valid information (and is therefore available for writing).

Once information is stored in a memory location, it is found by comparing every bit in memory with data in the comparand register. When the content stored in the CAM memory location does not match the data in the comparand register, the local match detection circuit returns a no match indication. When the content stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which the desired data is stored or one of such addresses if more than one address contained matching data. Thus, with a CAM, the user supplies the data and gets back the address if there is a match found in memory.

FIG. 1 is a circuit diagram showing a conventional DRAM-based CAM cell 100, which includes two one-transistor (1T) DRAM cells 110a and 110b, and a four-transistor comparator circuit 120 made up of transistors Q2 through Q6. DRAM cells 110a and 110b are used to store values. Generally, the content of cell 110a is the logical NOT of the content of cell 110b. However, the cells 110a, 110b may also store the same values, i.e., "1", "1", or "0", "0", so that the CAM cell is respectively set to "always match" or "always mismatch" states. DRAM cell 110a includes transistor Q1 and a capacitor CA, which combine to form a storage node A that receives a data value from bit line BL1 at node U during write operations, and applies the stored data value to the gate terminal of transistor Q2 of comparator circuit 120. Transistor Q2 is connected in series with transistor Q3, which is controlled by a data signal transmitted on data line D1, between a match line M and a discharge line D. The second DRAM cell 110b includes transistor Q3 and a capacitor CB, which combine to form a storage node B that receives a data value from bit line BL2 at node V, and applies the stored data value to the gate terminal of transistor Q4 of comparator circuit 120. Transistor Q4 is connected in series with transistor Q5, which is controlled by a data signal transmitted on inverted data line D1#, between the match line and the discharge line.

FIG. 2 is a block diagram of a portion of a CAM device 200 which includes a plurality of CAM cells, such as the CAM cell 100 of FIG. 1. For purposes of simplicity, only a portion of the CAM device 200 is illustrated. In particular, some well known components, such as the previously discussed comparand register, control logic, and I/O logic are not illustrated. The device 200 includes two arrays 210a, 210b of CAM cells 100. Each array 210a, 210b includes its own bit lines (e.g., BL11–BL16 for array 210a, BL21–BL26 for array 210b) and word lines (e.g., WL11–WL13 for array 210a). Each word line WL11–WL13, WL21–WL23 is coupled a respective word line driver 220a, 220b. Similarly, each bit line is also coupled to respective bit line drivers (not illustrated). The CAM device 200 also includes a plurality of sense amplifiers 230. Each sense amplifier 230 is coupled to the CAM cells 100 of two separate bit lines (e.g., bit lines BL11, BL21) from two different arrays. This type of architecture, where a sense amplifier is coupled to bit lines from different arrays, is known as an open bit line architecture.

Now referring back to FIG. 1, in order perform a write operation upon a CAM cell, the data values (which are complements) to be stored are respectively written to dynamic storage nodes A and B by applying appropriate voltage signals (e.g., Vcc for logical '1' or ground for logical '0') on bit lines BL11 and BL21, and then applying a high voltage signal on word lines WL1 and WL2. The high voltage on word lines WL1 and WL2 turn on transistor Q1 and Q2, thereby passing the voltage signals to dynamic storage nodes A and B. Refresh circuitry (not illustrated), periodically refreshes the charges stored in capacitors CA and CB, so the data does not decay over time.

In order to perform a match operation, the data stored at nodes A and B are respectively applied to the gate terminals of transistors Q2 and Q5 of comparator circuit 120. Comparator circuit 120 is utilized to perform match (comparison) operations by, for example, precharging the match line M, grounding the discharge line D, and transmitting an applied data value and its complement respectively on data lines D1 and D1# to the gate terminals of transistor Q3 and Q6, respectively. A no-match condition is detected when match line M is discharged to ground through the signal path formed by transistors Q2 and Q3 and the discharge line D, or through the signal path formed by transistors Q5 and Q6 and the discharge line D. For example, when the stored data value at node A and the applied data value transmitted on data line D1# are both logic "1", then both transistors Q2 and Q3 are turned on to discharge match line M to the discharge line (e.g., ground). When a match condition occurs, match line M remains in its pre-charged state (i.e., no signal path is formed by transistors Q2 and Q3, or transistors Q5 and Q6).

In order to perform a read operation, data stored as a charge level in the capacitors CA, CB of one of the dynamic storage nodes A, B of the CAM cell 100 is sensed using an associated sense amplifier 230 (FIG. 2) which compares the voltage level of a bit line coupled to one of the dynamic storage nodes (known as the active bit line) with the voltage level of a bit line not coupled to any dynamic storage nodes (known as the reference bit line). For example, node A of the CAM cell 100 which appears as the top left CAM cell illustrated in FIG. 2 can be sensed by first precharging two bit lines. The two bit lines to be precharged would include the bit line BL11 which will couple the CAM cell 100 to the sense amplifier 230 (i.e., the active bit line), as well as the other bit line BL21 coupled to the same sense amplifier 230 (i.e., the reference bit line). As illustrated in FIG. 2, each sense amplifier has one input coupled to a bit line of array 210a and another input coupled to a corresponding bit line of array 210b. The word line WL13 associated with the CAM cell 100 would then be charged, causing the transistor Q1 in the CAM cell 100 to conduct and thereby share the charge of capacitor CA with bit line BL1. The charge sharing alters the voltage level of bit line BL11. The sense amplifier 230 is then used to detect the change in potential between BL11 and BL21. The sense amplifier outputs an indication of the state stored at storage node A as a signal indicating the relative potential difference between bit lines BL11 and BL21 on line 235.

The performance of the above described read operation suffers from many noise issues since the sensing mechanism relies on the reference and active bit lines to be from two separate arrays of the device during a sensing operation. As CAM devices increase in density and therefore power consumption, the level of noise within a CAM cell is likely to increase. There is therefore a need for a CAM device architecture which has better noise immunity.

SUMMARY OF THE INVENTION

The present invention is directed to a CAM device which combines a folded bit line architecture with a standard six transistor DRAM based CAM cell. The CAM device of the present invention has a sensing scheme where the active and reference bit lines being sensed are each from the same memory array of the CAM device. Noise present in one array therefore appears as common mode noise in both the active and reference bit lines, thereby permitting the sensing operation to be performed accurately even in the presence of increased noise.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 3A:
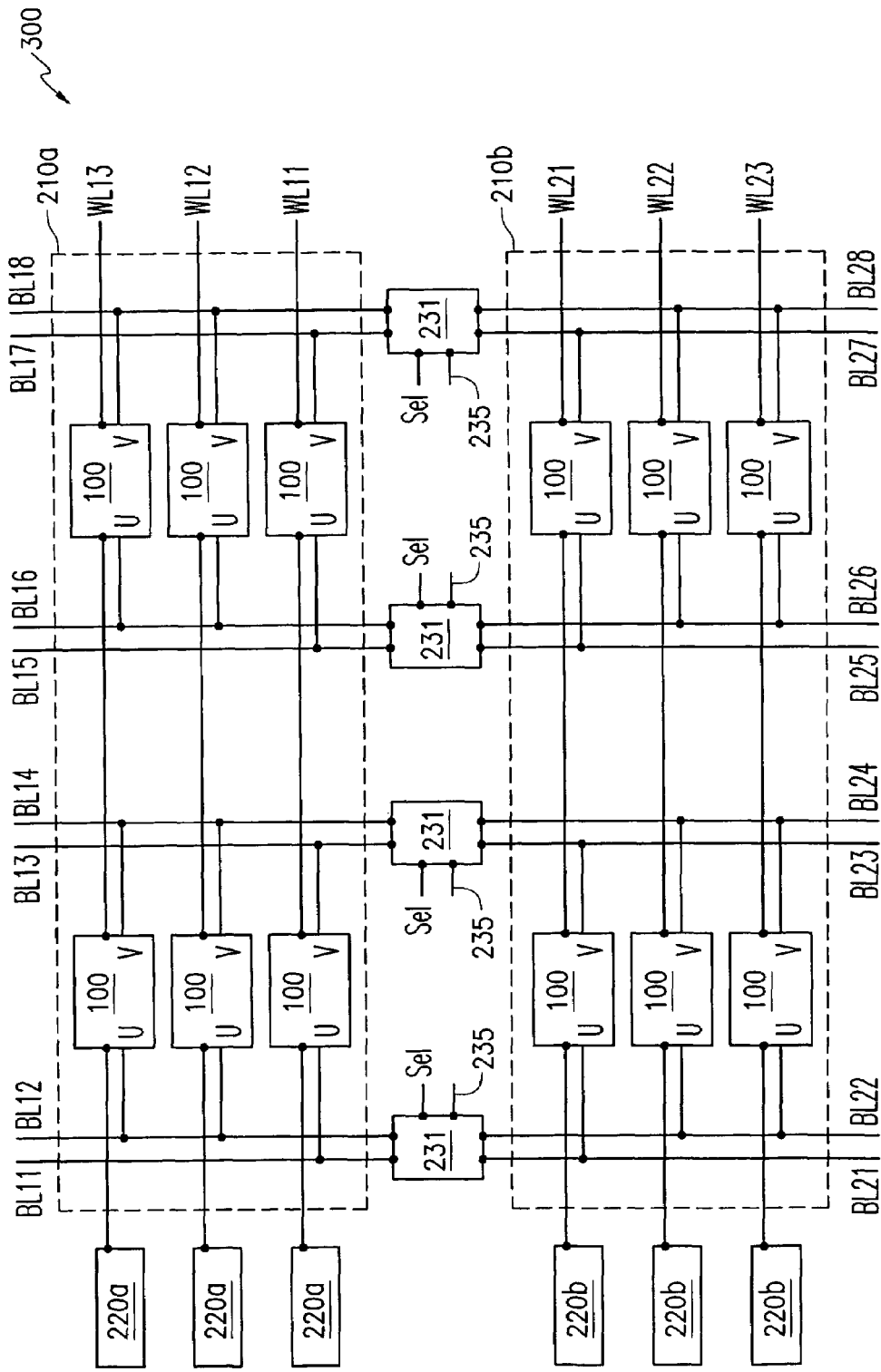
FIG. 3A is a block diagram illustrating a CAM device in accordance with a first embodiment of the present invention.

Now referring to the drawings, where like reference numerals designate like elements, there is shown in FIG. 3A a block diagram illustrating one embodiment of a CAM device 300 in accordance with the principles of the present invention.

Figure 1:
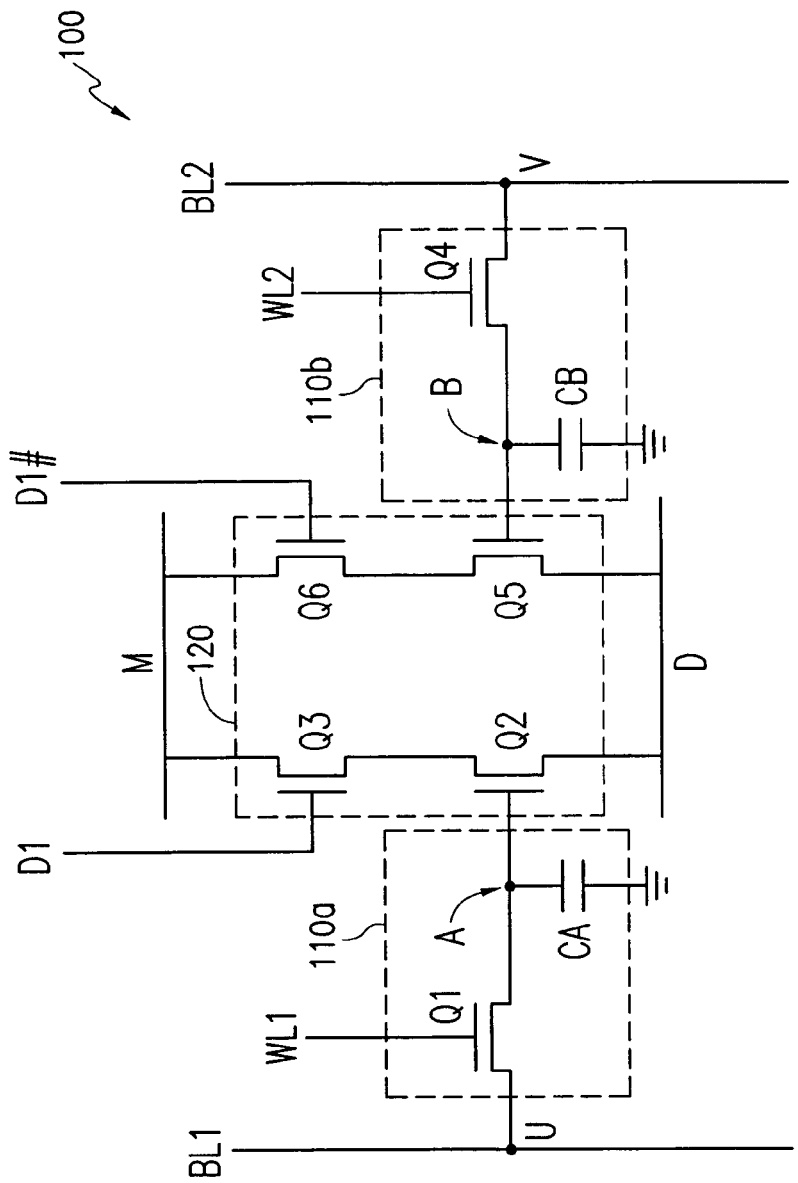
FIG. 1 is a circuit diagram of a conventional six transistor DRAM based CAM cell.
Figure 2:
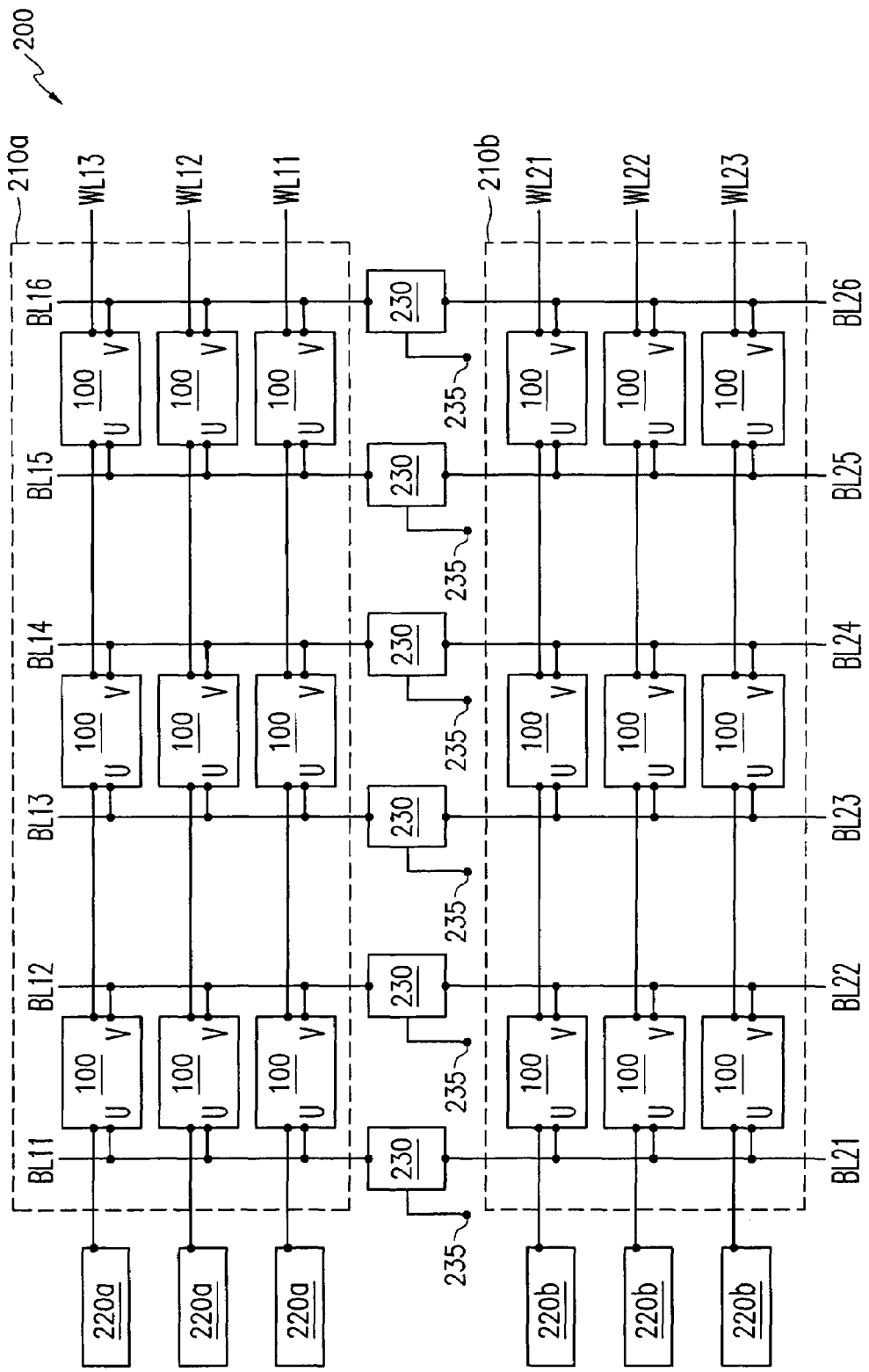
FIG. 2 is a block diagram illustrating a conventional CAM device using an open bit line scheme.

The device 300 is illustrated as having two arrays 210a, 210b of CAM cells 100. For purposes of simplicity, only a portion of the CAM device 300 is illustrated. In particular, some well known components, such as the comparand register, control logic, and I/O logic are not illustrated. It should be noted that the invention may be practiced even if the number of arrays is varied. Each array 210a, 210b is comprised of a plurality of CAM cells 100, which preferably are of the six transistor DRAM based embodiment previously discussed in connection with FIG. 1. Each CAM cell 100 is located at an intersection of a word line (e.g., WL11) and a bit line (e.g., BL11). Each word line is also coupled to a word line driver 220a, 220b. Each bit line is also coupled to a bit line driver (not illustrated) and a sense amplifier circuit 231.

Figure 4:
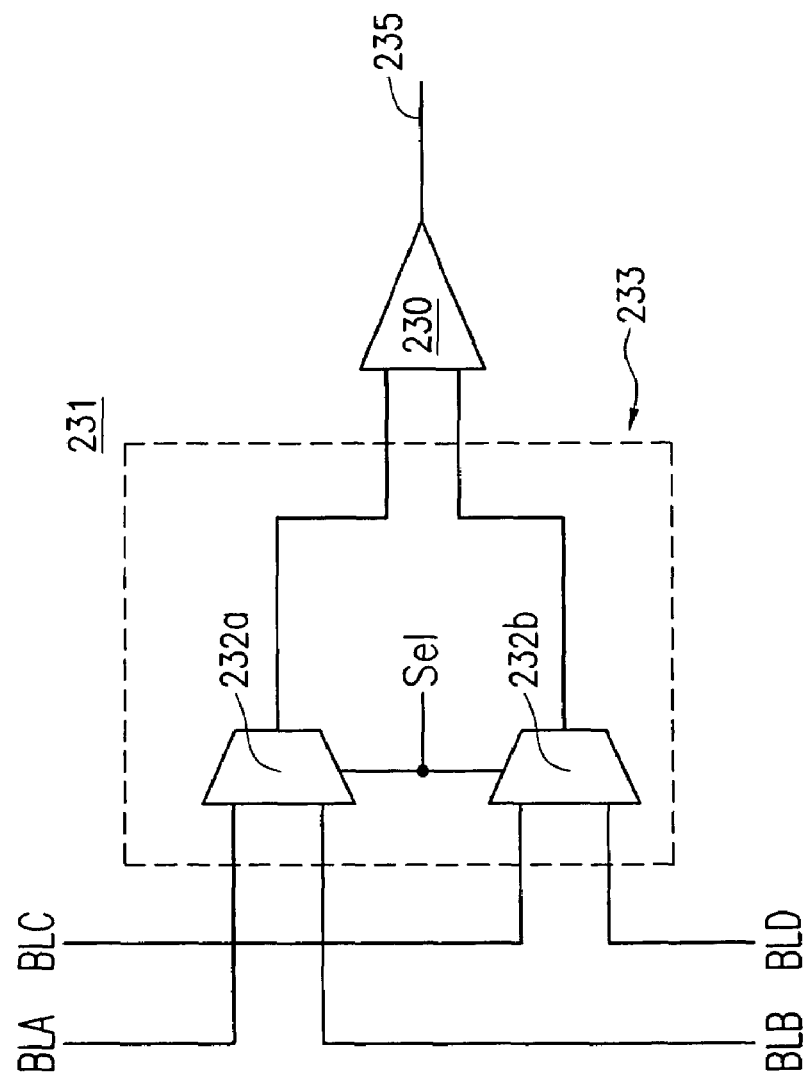
FIG. 4 is a circuit diagram of modified sense amplifier circuit used with the CAM device of FIG. 3.

Now referring also to FIG. 4, it can be seen that the sense amplifier circuit 231 is coupled to four inputs BLA, BLB, BLC, and BLD. The sense amplifier 231 includes a front-end circuit 233 comprising multiplexers 232a, 232b, and select signal input sel. (The sel signal can be controlled by the control circuit, which as noted above, is not illustrated in the drawings.) The two multiplexers 232a, 232b are controlled based on the state of the sel signal so that either signals BLA/BLC or signals BLB/BLD are selected for sensing by the sense amplifier 230. The result of the sensing is output on line 235.

Figure 3B:
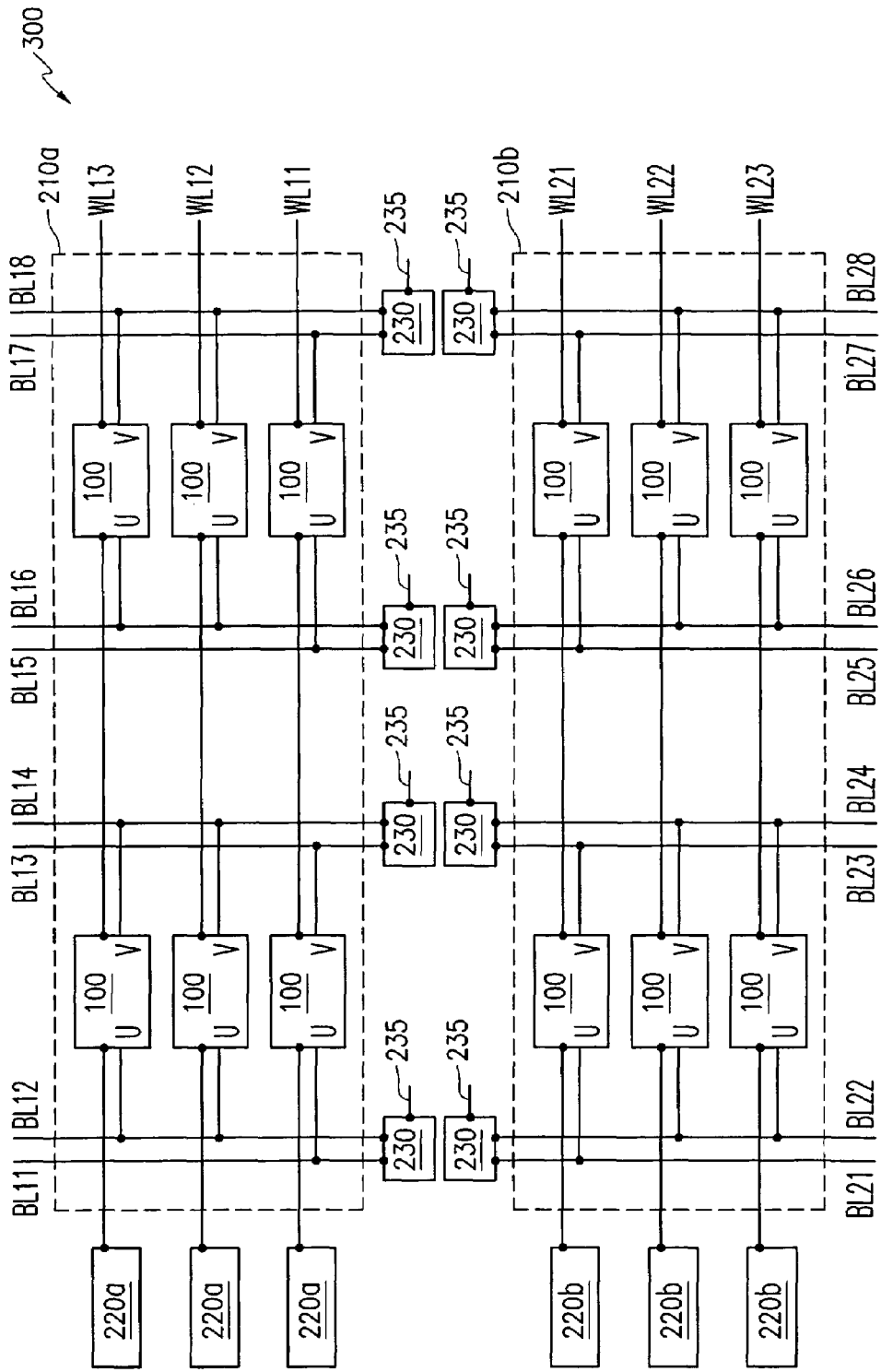
FIG. 3B is a block diagram illustrating a CAM device in accordance with a second embodiment of the present invention.

FIG. 3B is an illustration of the CAM device 300 built in accordance with a second embodiment of the present invention. The CAM device 300 of FIG. 3B differs from that illustrated in FIG. 3A by using pairs of sense amplifiers 230 instead of the single sense amplifier circuit 231. The embodiment illustrated in FIG. 3B therefore does not require the use of a sel control line for controlling the multiplexers 232a, 232b (FIG. 4) corresponding to the sense amplifier circuit 231 of FIG. 3A. However, the embodiment shown in FIG. 3B requires using twice as many sense amplifiers 230.

Thus, one significant difference between device 300 and prior art devices (e.g., device 200) is that each sensing operation is performed using an active and a reference bit line from the same array (e.g., 210a). By always sensing two lines from the same array, any noise which appears only in one array is less likely to disrupt the sensing operation because the noise will appears as common mode noise across both the active and reference bit lines, thereby identically affecting the potential of the active and reference bit lines, and having no effect on the potential difference at any point in time between the active and reference bit lines.

This property permits the use of ordinary sense amplifiers, even in higher level noise environments. By contrast, if an open bit line architecture were used, noise present in one array may result in an incorrect sensing operation.

Figure 5:
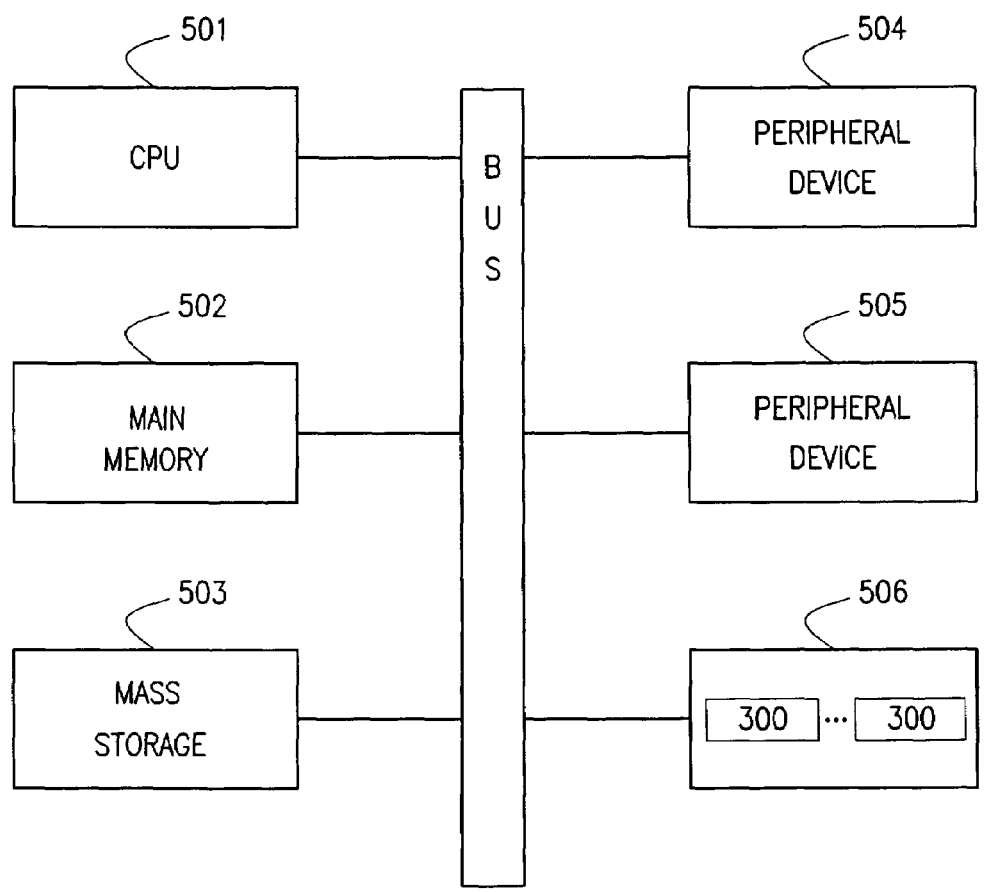
FIG. 5 is a block diagram of a processor based system utilizing the CAM device of the present invention.

FIG. 5 is an illustration of a processor based system 500 including a chip 300 in accordance with the present invention. The system 500 includes a central processing unit (CPU) 510, a main memory 502, at least one mass storage device 503, at least peripheral devices 504–505 (e.g., keyboard and display), and a CAM subsystem 506. The CAM subsystem 506 includes a plurality of CAM devices 300 of the present invention.

An example of a processor based system 500 may be a network router, in which case peripheral devices 504-505 may be network cards attached to different computer networks. The main memory 502 may include a random access memory for storing data, and a read only memory for storing a boot loader, and the mass storage device 503 may store an operating system and application software for the router. The CAM subsystem 506 may be used to store network routing table.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A content addressable memory comprising:
   a plurality of memory arrays, each comprising:
      a plurality of bit lines;
      a plurality of word lines, intersecting the plurality of bit lines;
      a plurality of CAM cells, each coupled to one of said plurality of bit lines and one of said plurality of word lines; and
      a plurality of sense amplifiers, wherein each of said plurality of sense amplifiers is operated to sense a potential difference between two bit lines from a same one of said plurality of memory arrays; and
   a switching circuit to selectively couple each one of the plurality of sense amplifiers to two bits lines from a first one of said plurality of memory arrays or two bit lines from a second one of said plurality of memory arrays.

2. The content addressable memory of claim 1, wherein said switching circuit comprises a pair of multiplexers.

3. The content addressable memory of claim 1, wherein each sense amplifier is disposed between said first and second ones of said plurality of memory arrays.

4. A content addressable memory comprising:
   a plurality of memory arrays, each comprising:
      a plurality of bit lines;
      a plurality of word lines, intersecting the plurality of bit lines;
      a plurality of CAM cells, each coupled to one of said plurality of bit lines and one of said plurality of word lines; and
      a plurality of sense amplifiers, each of said plurality of sense amplifiers being disposed between two of said plurality of memory arrays;
   wherein each of said plurality of sense amplifiers is operated to sense a potential difference between two bit lines from a same one of said plurality of memory arrays.

5. A processor based system, comprising:
   a bus;
   a processor, coupled to said bus;
   a main memory, coupled to said bus;
   a content addressable memory, coupled to said bus, said content addressable memory comprising:
      a plurality of memory arrays, each comprising:
         a plurality of bit lines;
         a plurality of word lines, intersecting the plurality of bit lines;
         a plurality of CAM cells, each coupled to one of said plurality of bit lines and one of said plurality of word lines; and
         a plurality of sense amplifiers, wherein each of said plurality of sense amplifiers is operated to sense a potential difference between two bit lines from a same one of said plurality of memory arrays; and
      a switching circuit to selectively couple each one of the plurality of sense amplifiers to two bits lines from a first one of said plurality of memory arrays or two bit lines from a second one of said plurality of memory arrays.

6. The system of claim 5, wherein said switching circuit comprises a pair of multiplexers.

7. The system of claim 5, wherein each sense amplifier is disposed between said first and second ones of said plurality of memory arrays.

8. A processor based system, comprising:
   a bus;
   a processor, coupled to said bus;
   a main memory, coupled to said bus;
   a content addressable memory, coupled to said bus, said content addressable memory comprising:
      a plurality of memory arrays, each comprising:
         a plurality of bit lines;
         a plurality of word lines, intersecting the plurality of bit lines;
         a plurality of CAM cells, each coupled to one of said plurality of bit lines and one of said plurality of word lines; and
         a plurality of sense amplifiers;
      wherein each of said plurality of sense amplifiers is operated to sense a potential difference between two bit lines from a same one of said plurality of memory arrays and wherein each of said plurality of sense amplifiers is disposed between two of said plurality of memory arrays.

9. A processor based system, comprising:
   a bus;
   a processor, coupled to said bus;
   a content addressable memory, coupled to said bus, said content addressable memory comprising:
      a plurality of memory arrays, each comprising:
         a plurality of bit lines;

a plurality of word lines, intersecting the plurality of bit lines;

a plurality of CAM cells, each coupled to one of said plurality of bit lines and one of said plurality of word lines; and a plurality of sense amplifiers;

wherein each of said plurality of sense amplifiers is operated to sense a potential difference between two bit lines from a same one of said plurality of memory arrays;

a first network interface, coupled to said bus and a first network; and a second network interface, coupled to said bus and a second network;

wherein said system is operated to route network traffic between said first and second networks.

10. The system of claim 9, wherein said content addressable memory stores routing information.

* * * * *

UNITED STATES PATENT AND TRADEMARK OFFICE
CERTIFICATE OF CORRECTION

PATENT NO. : 7,088,603 B2
APPLICATION NO. : 11/010574
DATED : August 8, 2006
INVENTOR(S) : Vipul Patel It is certified that error appears in the above-identified patent and that said Letters Patent is hereby corrected as shown below:

Column 1, line 48, "indicate" should read --indicates--;

Column 2, line 37, "coupled a" should read --coupled to a--;

Column 2, line 45, "order perform" should read --order to perform--;

Column 4, line 63, "appears" should read --appear--; and

Column 5, line 21, "table" should read --tables--.

In the Claims, the following errors are corrected:

Claim 1, column 5, line 48, "bits" should read --bit--; and

Claim 5, column 6, line 27, "bits" should read --bit--.

Signed and Sealed this

Twelfth Day of December, 2006

JON W. DUDAS
*Director of the United States Patent and Trademark Office*